US009931709B2

(12) United States Patent
DeAngelis

(10) Patent No.: US 9,931,709 B2
(45) Date of Patent: Apr. 3, 2018

(54) WEDGE BONDING TOOLS, WEDGE BONDING SYSTEMS, AND RELATED METHODS

(71) Applicant: ORTHODYNE ELECTRONICS CORPORATION, Wilmington, DE (US)

(72) Inventor: Dominick A. DeAngelis, Villanova, PA (US)

(73) Assignee: Orthodyne Electronics Corporation, Wilmington, DE (US)

( * ) Notice: Subject to any disclaimer, the term of this patent is extended or adjusted under 35 U.S.C. 154(b) by 0 days.

(21) Appl. No.: 15/409,172

(22) Filed: Jan. 18, 2017

(65) Prior Publication Data

US 2017/0209956 A1    Jul. 27, 2017

Related U.S. Application Data

(60) Provisional application No. 62/287,148, filed on Jan. 26, 2016.

(51) Int. Cl.
*B23K 31/02* (2006.01)
*B23K 20/10* (2006.01)
*H01L 23/00* (2006.01)
*B23K 20/00* (2006.01)

(52) U.S. Cl.
CPC .......... *B23K 20/106* (2013.01); *B23K 20/004* (2013.01); *B23K 20/005* (2013.01); *H01L 24/78* (2013.01); *H01L 2224/45014* (2013.01); *H01L 2224/78252* (2013.01); *H01L 2224/78349* (2013.01)

(58) Field of Classification Search
CPC ..... B23K 20/004–20/007; H01L 24/85; H01L 24/86
USPC ...................... 228/180.5, 4.5, 904
See application file for complete search history.

(56) References Cited

U.S. PATENT DOCUMENTS

| 3,593,906 A | * | 7/1971 | Hug ..................... | B23K 20/005 156/73.1 |
| 3,627,192 A | * | 12/1971 | Killingsworth ...... | B23K 20/005 219/229 |
| 3,934,783 A | * | 1/1976 | Larrison .............. | B23K 20/005 228/1.1 |
| 4,030,657 A | * | 6/1977 | Scheffer ............... | B23K 20/005 228/1.1 |

(Continued)

FOREIGN PATENT DOCUMENTS

| DE | 19508617 | 5/1996 |
| DE | 10028774 | 9/2001 |

(Continued)

OTHER PUBLICATIONS

International Search Report for PCT/US2017/013951 issued by the Korean Intellectual Property Office dated May 11, 2017.

(Continued)

*Primary Examiner* — Kiley Stoner
(74) *Attorney, Agent, or Firm* — Christopher M. Spletzer, Sr.

(57) ABSTRACT

A wedge bonding tool including a body portion including a tip portion is provided. The tip portion includes a working surface configured to contact a wire material during formation of a wedge bond. A plurality of notches are defined by one or more surfaces of the body portion.

18 Claims, 7 Drawing Sheets

(56) References Cited

U.S. PATENT DOCUMENTS

| | | | |
|---|---|---|---|
| 4,405,074 A | 9/1983 | Levintov et al. | |
| 5,018,658 A * | 5/1991 | Farassat | B23K 20/005 228/15.1 |
| 5,148,959 A * | 9/1992 | Cain | B23K 20/005 228/4.5 |
| 5,364,004 A * | 11/1994 | Davidson | H01L 24/11 228/1.1 |
| 5,495,976 A * | 3/1996 | Mironesco | B23K 20/004 228/1.1 |
| 5,558,270 A * | 9/1996 | Nachon | B23K 20/005 228/180.5 |
| 5,890,643 A | 4/1999 | Razon et al. | |
| 5,906,706 A | 5/1999 | Farassat | |
| 6,135,341 A * | 10/2000 | Falcone | B23K 20/004 228/110.1 |
| 6,321,969 B1 * | 11/2001 | Miller | B23K 20/005 228/1.1 |
| 6,354,479 B1 * | 3/2002 | Reiber | B23K 20/005 219/56.21 |
| 6,501,043 B1 * | 12/2002 | Ruben | B23K 26/22 219/121.63 |
| 6,715,658 B2 | 4/2004 | Perlberg et al. | |
| 6,905,058 B2 | 6/2005 | Farassat | |
| 7,311,239 B2 * | 12/2007 | Laurent | G01R 1/06705 228/1.1 |
| 7,597,231 B2 | 10/2009 | Castaneda et al. | |
| 7,745,253 B2 | 6/2010 | Luechinger | |
| 7,909,228 B2 | 3/2011 | Delsman et al. | |
| 8,820,609 B2 | 9/2014 | Walker | |
| 2005/0109814 A1 * | 5/2005 | Reiber | B23K 20/004 228/4.5 |
| 2005/0218188 A1 | 10/2005 | Lee et al. | |
| 2005/0258215 A1 * | 11/2005 | Vasquez | H01L 21/67138 228/180.5 |
| 2005/0279811 A1 * | 12/2005 | Bell | B23K 20/004 228/180.5 |
| 2006/0163315 A1 * | 7/2006 | Delsman | B23K 20/004 228/1.1 |
| 2008/0272176 A1 | 11/2008 | Vasquez et al. | |
| 2009/0152327 A1 | 6/2009 | Matsumura | |
| 2011/0241224 A1 * | 10/2011 | Tsubaki | B23K 20/005 257/784 |
| 2011/0259939 A1 * | 10/2011 | Farassat | B23K 20/004 228/1.1 |
| 2011/0266331 A1 * | 11/2011 | Copperthite | B23K 20/004 228/155 |
| 2012/0286023 A1 | 11/2012 | DeAngelis et al. | |
| 2014/0103095 A1 * | 4/2014 | Walker | H01L 24/78 228/1.1 |
| 2014/0326778 A1 * | 11/2014 | Lee | H01L 24/78 228/1.1 |
| 2015/0235983 A1 * | 8/2015 | Delsman | H01L 24/78 228/1.1 |

FOREIGN PATENT DOCUMENTS

| | | | |
|---|---|---|---|
| EP | 0144915 A2 * | 6/1985 | H01L 24/06 |
| JP | 6181243 | 6/1994 | |
| JP | 2004087822 | 3/2004 | |
| JP | 2009147185 | 7/2009 | |
| KR | 101504646 | 12/2014 | |
| WO | 2009014494 | 1/2009 | |

OTHER PUBLICATIONS

Micro Point Pro Website, accessed on Sep. 21, 2016, http://www.mpptools.com/MicroPoint/Templates/showpage.asp?DBID=1&LNGID=1&TMID=108&FID=1512&PID=0&IID=2014.

* cited by examiner

STEP 500: DETERMINE A LOCATION OF AT LEAST ONE ANTI-NODE OF A WEDGE BONDING TOOL IN AN OFF-AXIS DIRECTION OF THE WEDGE BONDING TOOL

STEP 502: FORM A NOTCH IN A SURFACE OF THE WEDGE BONDING TOOL AT THE LEAST ONE ANTI-NODE

WEDGE BONDING TOOLS, WEDGE BONDING SYSTEMS, AND RELATED METHODS

CROSS-REFERENCE TO RELATED APPLICATION

This application claims the benefit of U.S. Provisional Application No. 62/287,148, filed Jan. 26, 2016, the content of which is incorporated herein by reference in its entirety.

FIELD

The invention relates to wedge bonding systems, and more particularly, to wedge bonding tools for wedge wire bonding systems.

BACKGROUND

In the processing and packaging of semiconductor devices or other devices, ultrasonic wire bonding (e.g., ball bonding, wedge bonding, ribbon bonding, etc.) continues to be a widely used method of providing electrical interconnection between two locations (e.g., between a die pad of a semiconductor die and a lead of a leadframe). An upper end of a bonding tool is, in many instances, configured to be engaged in a transducer (e.g., an ultrasonic transducer) of an ultrasonic bonding system which causes the bonding tool to vibrate during bonding. Ultrasonic wire bonding is a joining process that, for example, uses relative motion between the wire and an underlying surface (e.g., a bonding location of a substrate) to facilitate bonding of the wire to that underlying surface. This relative motion is provided by a tip portion of the wire bonding tool.

Wedge bonding is one well known type of wire bonding. Wedge bonding tools (sometimes referred to as "wedges" and "bonding wedges", which may be formed from a number of materials such as steel, tungsten, tungsten carbide, silicon carbide, etc.) are intended to provide a scrubbing motion along on or more axes. In many conventional wedge bonding systems, the desired scrubbing motion is along a single substantially linear motion direction such as, for example, the x-axis of the wedge bonding system, the y-axis of the wedge bonding system, etc.

Although the desired scrubbing motion may be along a single motion axis, non-desirable scrubbing motions may also occur along one or more additional axes. These non-desirable scrubbing motions may cause a number of issues, for example: side scooting of a tip portion of the wedge bonding tool; inefficient use of ultrasonic energy; short circuiting between adjacent wedge bonds; wedge bonds that do not stick properly to the appropriate bonding location; issues related to the mechanism (e.g., a set screw mechanism, etc.) used to secure a wedge bonding tool in place with respect to an ultrasonic transducer; amongst others.

Thus, it would be desirable to provide improved wedge bonding tools, improved wedge bonding systems, and related methods of providing/designing such wedge bonding tools and wedge bonding systems.

SUMMARY

According to an exemplary embodiment of the invention, a wedge bonding tool is provided. The wedge bonding tool includes a body portion having a tip portion. The tip portion includes a working surface configured to contact a wire material during formation of a wedge bond. A plurality of notches are defined by one or more surfaces of the body portion.

According to another exemplary embodiment of the invention, a wedge bonding system is provided. The wedge bonding system includes an ultrasonic transducer; a wedge bonding tool carried by the ultrasonic transducer, the wedge bonding tool including a body portion having a tip portion, the tip portion including a working surface configured to contact a wire material during formation of a wedge bond, a plurality of notches being defined by one or more surfaces of the body portion; and a support structure configured to support a workpiece during formation of the wedge bond on the workpiece.

According to another exemplary embodiment of the invention, a method of providing a wedge bonding tool is provided. The method includes: (a) determining a location of at least one anti-node of a wedge bonding tool in an off-axis direction of the wedge bonding tool; and (b) forming a notch in a surface of the wedge bonding tool at the at least one anti-node.

The various embodiments of the invention described in this SUMMARY section of the application may be applied to wedge bonding tools including protrusions (e.g., as shown in the example of FIG. 6) as opposed to notches (e.g., as shown in the examples of FIGS. 1A-1D, FIGS. 2A-2B). Specifically: (a) an inventive wedge bonding tool includes a body portion having a tip portion, where the tip portion includes a working surface configured to contact a wire material during formation of a wedge bond, and where a plurality of protrusions are included along one or more surfaces of the body portion (such as in the example of FIG. 6); (b) an inventive wedge bonding system includes an ultrasonic transducer, a wedge bonding tool carried by the ultrasonic transducer, and a support structure configured to support a workpiece during formation of the wedge bond on the workpiece, where the wedge bonding tool includes a body portion having a tip portion, where the tip portion includes a working surface configured to contact a wire material during formation of a wedge bond, and where a plurality of protrusions are included along one or more surfaces of the body portion (such as in the example of FIG. 6); and (c) an inventive method of providing a wedge bonding tool includes: (c1) determining a location of at least one anti-node of a wedge bonding tool in an off-axis direction of the wedge bonding tool, and (c2) providing at least one protrusion along one or more surfaces of the body portion (such as in the example of FIG. 6) at the at least one anti-node.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1A:
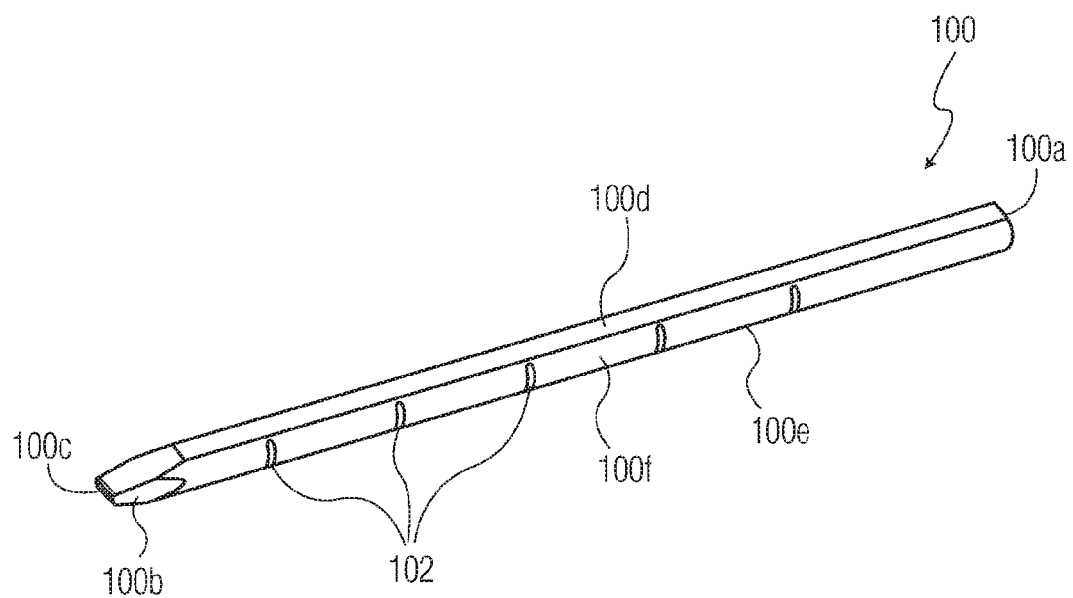
FIGS. 1A-1D are perspective, front, side, and top views, respectively, of a wedge bonding tool in accordance with an exemplary embodiment of the invention.

As used herein, the terms "notch" and "notches" shall be broadly construed to refer to any type of notch, groove, slit, hole or other aperture (including any aperture formed by the removal of material from the wedge bonding tool), extending in any direction, in a surface of wedge bonding tool.

As used herein, the terms "wire" and "wire material" shall be broadly construed to refer to any type of conductive material (including coated conductive material, multi-layer materials including at least one conductive material layer, etc.) used to form wedge wire bonds such as wire having a round cross section, wire having a rectangular cross section (e.g., conductive ribbon, etc.), etc.

As used herein, the term "off-axis" shall be broadly construed to refer to motion of a tip portion of a wedge bonding tool in an undesirable direction. That is, a wedge bonding tool may be configured to form a wedge wire bond by motion of the tip portion (e.g., scrub of the tip portion) along a specific axis—and off-axis motion refers to motion (undesirable motion) of the tip portion in other directions (e.g., along other axes) that are not configured to form the wedge wire bond.

As used herein, the term "ultrasonic" is intended to cover vibrations of tip portions of wedge bonding tools at ultrasonic frequencies, and other frequencies (e.g., lower frequencies, such as below 20 kHz, that may nonetheless be used in the formation of wedge wire bonds).

According to various exemplary embodiments of the invention, a single notch, or a plurality of notches (e.g., directional notches), are made in targeted locations along an axis of an ultrasonic wedge bonding tool to change its dynamic response in a desired way. Examples of such targeted locations include, but are not limited to, dynamic nodes, dynamic anti-nodes, as well as static geometric locations such as an area of tool clamping. The directionality of these notches can be along specified coordinate axes (e.g., an x-axis, a y-axis, a z-axis, etc.), or in arbitrary directions, or both.

The notches formed in the wedge bonding tool may be used to provide a more tailored design optimization of such tools with a goal of improving the quality of the ultrasonic wedge wire bonding system. Such design optimization may be configured to provide: a reduced coupling of unwanted dynamic parasitic modes in a wedge bonding tool; improved directional delivery of ultrasonic scrub energy via axial balancing; an improved gain relationship between an ultrasonic transducer and the wedge bonding tool; amongst others.

In contrast to conventional wedge bonding tools, with limited design capabilities, targeted notches provided in connection with the invention provide for tailored optimization/performance through the use of the inventive wedge bonding tools. For example, targeted notches may be provided for "rework"—that is, existing wedge bonding tools may be altered with the targeted notches to provide the desired system optimization/performance. The notches may be added without subsequent changes to wedge bonding system process parameters (e.g., the bonding parameters used to create wire bonds). Thus, a "drop-in" replacement tool may be provided with improved characteristics in terms of bond quality, etc.

In connection with the invention, targeted directional notches in a wedge bonding tool may be utilized to shift a resonant frequency of undesirable scrubbing motion (e.g., scrubbing along the x-axis when the intended/desirable scrubbing occurs along the y-axis). That is, in connection with certain conventional wedge bonding tools, in addition to the desired scrubbing motion (e.g., along the y-axis), the operating frequency of a wedge bonding system may also produce an undesirably high magnitude of scrubbing in a different and undesired direction (e.g., along the x-axis). Targeted notches in the wedge bonding tool may space the parasitic modes in the different (and undesired) direction away from the resonant frequency.

In accordance with the invention—it is understood that wedge bonding systems (e.g., including at least one of an ultrasonic transducer, the wedge bonding tool, the workpiece, the support structure of the workpiece, etc.) have at least one desired resonant frequency for providing a desired scrub of the tip portion of a wedge bonding tool. The wedge bonding system operates at the resonant frequency to provide efficient scrubbing of the wedge bonding tool tip portion in a desired direction (e.g., along the y-axis). The wedge bonding tool may also have an off-axis resonant frequency providing scrubbing of the tip portion of the wedge bonding tool in an undesired direction. The notches may be designed into a wedge bonding tool that change the off-axis resonant frequency so that it no longer coincides with the operating frequency of the wedge bonding system.

In certain exemplary embodiments of the invention, it may be desirable to change the stiffness of the wedge bonding tool in a direction of off-axis resonance (e.g., to change the frequency of the anti-nodes), while not changing the stiffness in the desired scrubbing direction.

In accordance with certain embodiments of the invention, the vibration of the wedge bonding system may be modeled/measured (e.g., using finite element analysis, vibration measurement systems such as a vibrometer, etc.) to determine the anti-nodes (points of maximum displacement in the off-axis, undesired, direction). Then, the desired notches may be formed at one or more anti-nodes to reduce the stiffness only in the undesired direction without changing the stiffness in the desired direction.

Figure 1B:
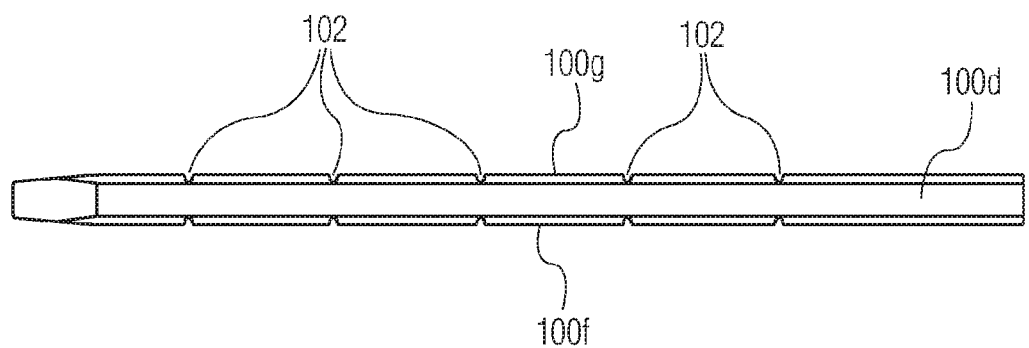
Figure 1C:
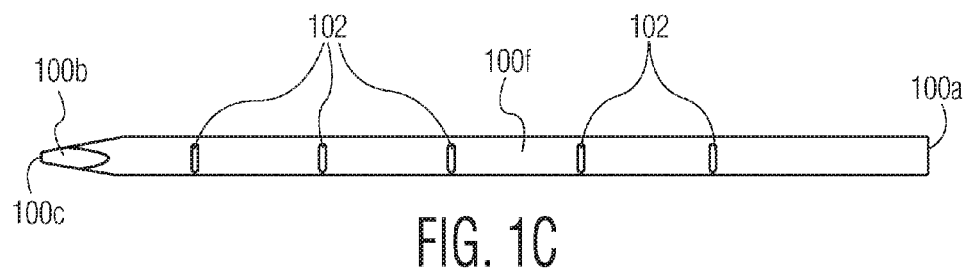
Figure 1D:
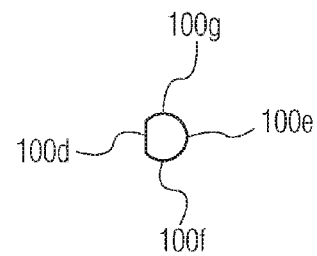

Referring now to the drawings, FIGS. 1A-1D illustrate various views of a wedge bonding tool 100. More specifically, FIG. 1A is a perspective view of wedge bonding tool 100, FIG. 1B is a front view of wedge bonding tool 100, FIG. 1C is a side view of wedge bonding tool 100, and FIG. 1D is a top end view (looking down) of wedge bonding tool 100.

Wedge bonding tool 100 includes an elongate body portion extending between top end portion 100a and tip end portion 100b. Tip end portion 100b includes a working surface 100c configured to contact a wire material (e.g., a wire material having a round cross section, a wire material having a rectangular cross section such as a conductive ribbon material, etc.) during formation of wire bonds between the wire material and respective bonding locations.

The body portion of wedge bonding tool 100 includes front surface 100d, back surface 100e, side surface 100f, and side surface 100g. As made clear in FIG. 1D, front surface 100d is substantially flat, while each of back surface 100e, side surface 100f, and side surface 100g follow a curved path. As shown in FIGS. 1A-1C, a plurality of notches 102 are defined by each of side surfaces 100f, 100g (sometimes referred to as a first side, and a second side, or opposite sides, of wedge bonding tool 100). In the embodiment of the invention shown in FIGS. 1A-1D, the plurality of notches are provided as pairs of notches, provided opposite one another on opposite sides of wedge bonding tool 100. For example, tools according to the invention may include at least three pairs of notches, where each of the pairs of notches includes a notch opposite another notch on opposite sides of the body portion of the tool.

For example, in an embodiment of the invention where the desirable scrubbing motion of tip portion 100b is in a direction between front surface 100d and back surface 100e (i.e., where such direction is into and out of the page in FIG. 1B, and is referred to herein as the "y" direction, or along the y-axis as defined by a wedge bonding machine), the notches 102 are desirably formed in side surfaces 100f, 100g to reduce undesirable scrubbing motion along one or more other axes. In a specific example, the notches 102 are provided to reduce scrubbing along the x-axis (i.e., motion in the direction between side surface 100f and side surface 100g). Such scrubbing motions along the x-axis may be caused by parasitic modes of the wedge bonding tool in the off-axis direction.

Figure 2A:
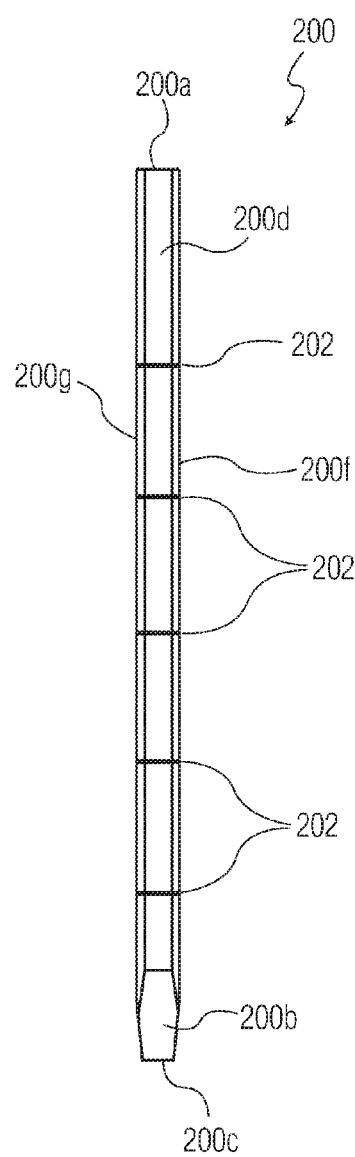
FIGS. 2A-2B are front and side views, respectively, of a wedge bonding tool in accordance with another exemplary embodiment of the invention.
Figure 2B:
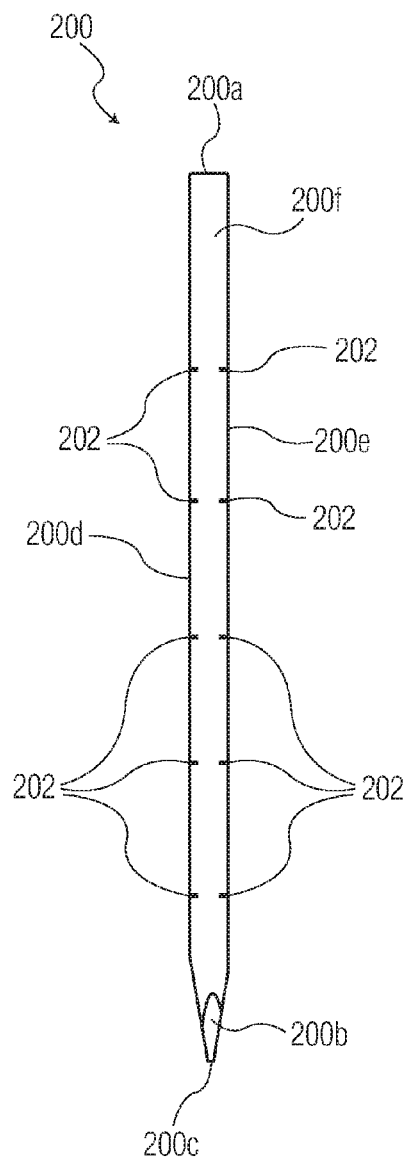

The invention is not limited to the inclusion of notches in the body portion to remove undesirable scrubbing motions (e.g., parasitic motions). Such notches may be provided for additional reasons, such as: improved directional delivery of ultrasonic scrub energy via axial balancing; an improved gain relationship between an ultrasonic transducer and the wedge bonding tool; amongst others. FIGS. 2A-2B illustrate a wedge bonding tool 200 that is similar in many respects to wedge bonding tool 100 described in connection with FIGS. 1A-1D, except for the placement of the notches (the notches are referred to as 202 in FIGS. 2A-2B, as opposed to 102 in FIGS. 1A-1D). Wedge bonding tool 200 includes an elongate body portion extending between top end portion 200a and tip end portion 200b. Tip end portion 200b includes a working surface 200c configured to contact a wire material during formation of wire bonds between the wire material and respective bonding locations. The body portion of wedge bonding tool 200 includes front surface 200d, back surface 200e, side surface 200f, and side surface 200g. As shown in FIGS. 2A-2B, a plurality of notches 202 are defined by each of front surface 200d and back surface 200e (where surfaces 200d, 200e may be referred to as a first side, and a second side, or opposite sides, of wedge bonding tool 200). In the embodiment of the invention shown in FIGS. 2A-2B, the plurality of notches are provided as pairs of notches, provided opposite one another on opposite sides of wedge bonding tool 200. For example, tools according to the invention may include at least three pairs of notches, where each of the pairs of notches includes a notch opposite another notch on opposite sides of the body portion of the tool.

FIGS. 1A-1D and FIGS. 2A-2B illustrate just two examples of wedge bonding tools including notches formed in sides of the body portion. As will be appreciated by those skilled in the art, such notches may be included in a number of different locations, to provide a number of different results, within the scope of the invention.

Figure 3A:
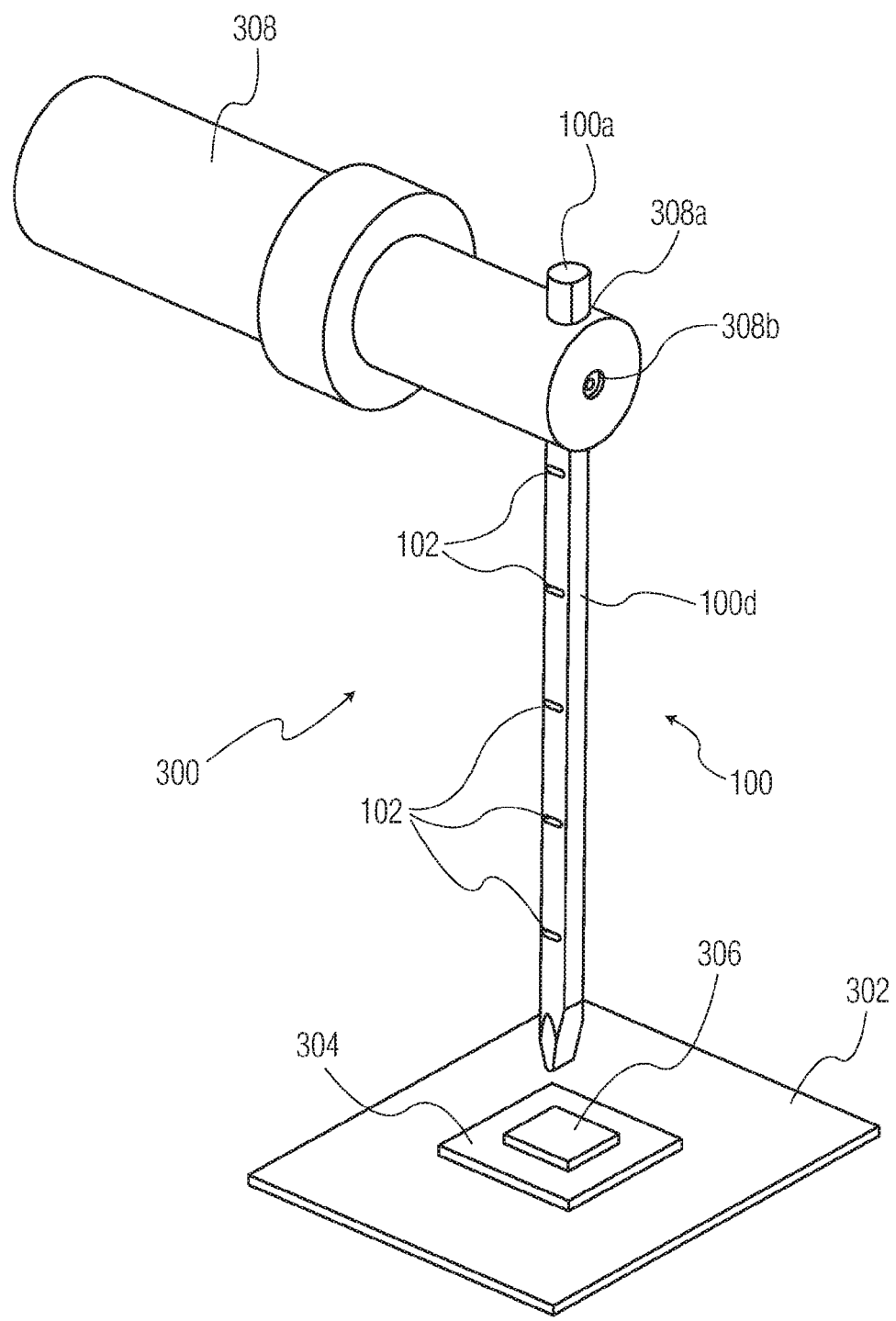
FIGS. 3A-3B are perspective and side views, respectively, of a wedge bonding system in accordance with an exemplary embodiment of the invention.
Figure 3B:
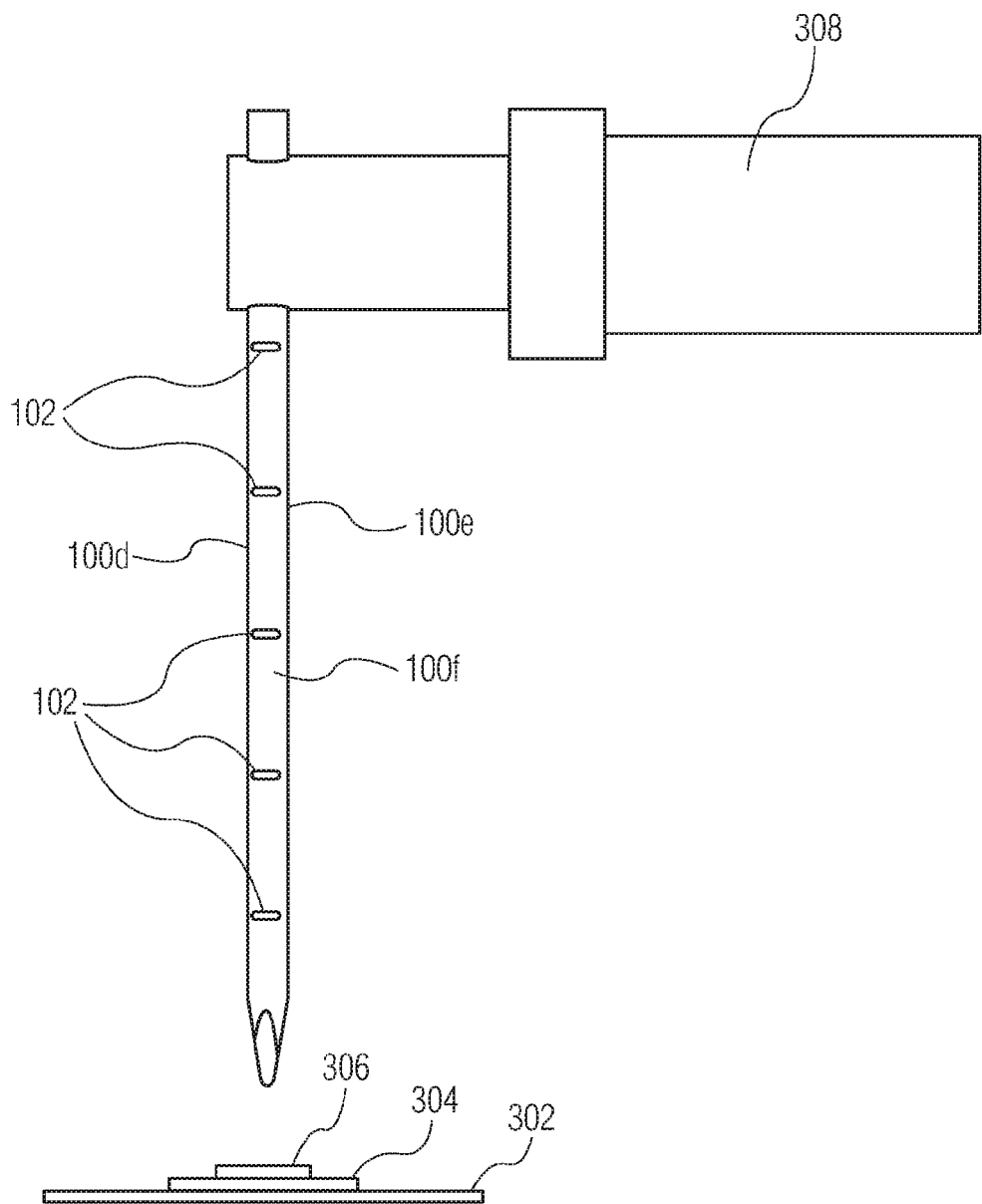

FIGS. 3A-3B illustrate wedge bonding system 300. Wedge bonding system 300 includes an ultrasonic transducer 308 carrying a wedge bonding tool 100. Wedge bonding tool 100 is received by an aperture 308a of ultrasonic transducer 308. A securing mechanism 308b (e.g., a set screw 308b) is tightened against the flat surface of front surface 100d, thereby securing wedge bonding tool 100 in place with respect to ultrasonic transducer 308. Wedge bonding system 300 also includes a support structure 302 (e.g., an anvil, a heatblock, etc.) configured to support a workpiece 304 (e.g., a substrate 304 including a semiconductor die 306) during formation of the wedge bond on workpiece 304.

Figures 5, 6:
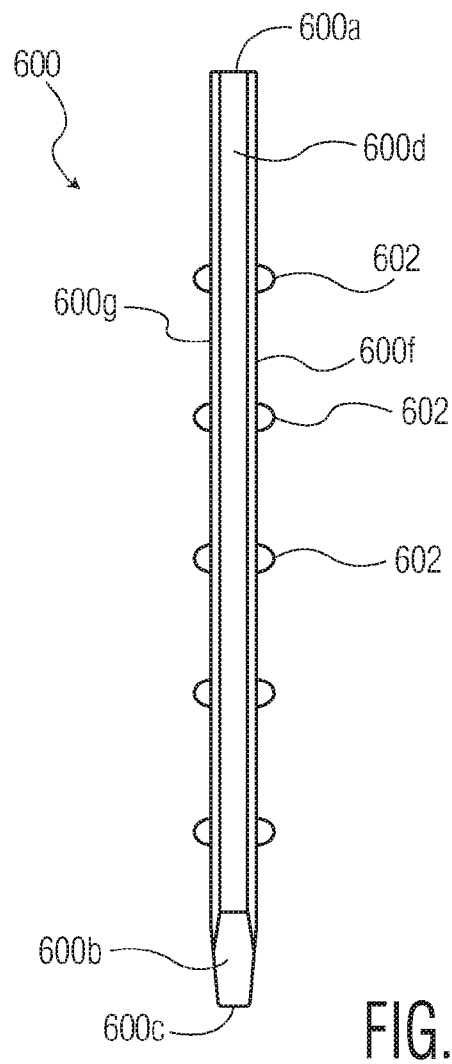
FIG. 5 is a flow diagram illustrating a method of providing a wedge bonding tool in accordance with an exemplary embodiment of the invention.
FIG. 6 is a front view of a wedge bonding tool in accordance with yet another exemplary embodiment of the invention.

Although FIGS. 3A-3B illustrate wedge bonding tool 100 (illustrated and described in connection with FIGS. 1A-1D), it is understood that any wedge bonding tool within the scope of the invention may be included in wedge bonding system 300 (including, for example, wedge bonding tools having features illustrated in FIGS. 2A-2B and in FIG. 6). As will be appreciated by those skilled in the art, additional elements of wedge bonding system 300 (e.g., a wire supply, a wire feed system, a material handling system, etc.) are omitted for simplicity.

Figure 4:
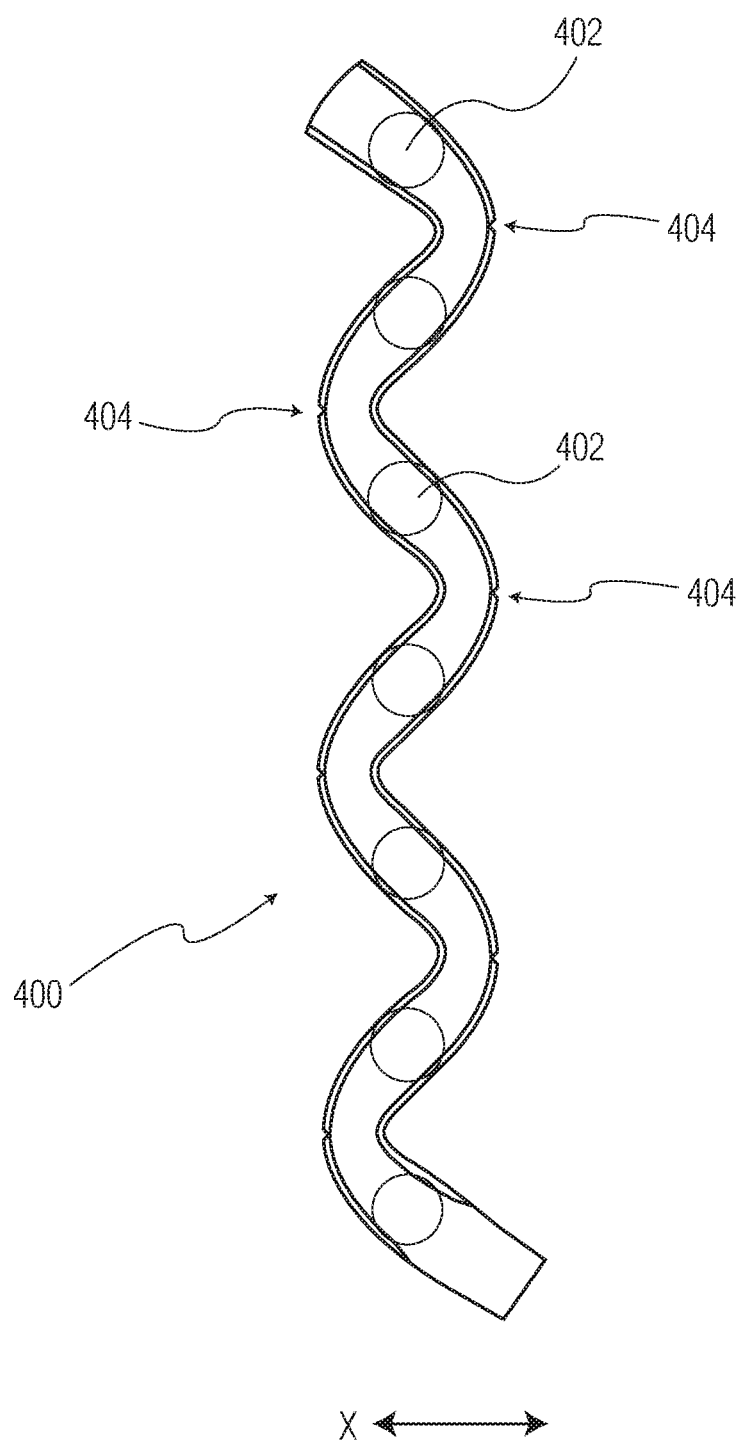
FIG. 4 is a block diagram illustrating scrub of a wedge bonding tool in a non-desirable direction, and notches designed to address the non-desirable scrub, in accordance with an exemplary embodiment of the invention.

FIG. 4 illustrates a parasitic mode shape 400 of a wedge bonding tool along an x-axis (i.e., in an embodiment where the desired scrub of the tip portion of the wedge bonding tool is along the y-axis (i.e., into the page), and undesirable scrub may occur along the x-axis). Mode shape 400 includes a plurality of nodes 402 (e.g., points of zero, or substantially zero, displacement along the x-axis). Mode shape 400 includes a plurality of anti-nodes 404 (e.g., points of maximum, or substantially maximum, displacement along the x-axis). As shown in FIG. 4, notches are illustrated at each of the anti-nodes 404, to adjust the resonant frequency of the parasitic mode (i.e., creating a larger gap between such resonant frequency and an operating mode of the wedge bonding system), thereby reducing the undesirable x-axis scrub of the wedge bonding tool.

FIG. 5 is a flow diagram in accordance with certain exemplary embodiments of the invention. As is understood by those skilled in the art, certain steps included in the flow diagram may be omitted; certain additional steps may be added; and the order of the steps may be altered from the order illustrated.

Referring specifically to the flow diagram in FIG. 5, a method of providing a wedge bonding tool is provided. At Step 500, a location of at least one anti-node of a wedge bonding tool in an off-axis direction of the wedge bonding tool is determined. For example, the at least one anti-node (and perhaps a plurality of anti-nodes) may be determined by modeling the wedge bonding tool (e.g., using finite element analysis) to determine the location of the at least one anti-node of the wedge bonding tool. In another example, the at least one anti-node (and perhaps a plurality of anti-nodes) may be determined by taking vibration measurements (e.g., using a vibrometer) to determine the location of the at least one anti-node of the wedge bonding tool.

At Step 502, a notch (and perhaps a plurality of notches) are formed in a surface of the wedge bonding tool at the at least one anti-node. For example, the notch/notches may be formed by electrical discharge machining (i.e., EDM), laser machining, etc. The notch/notches may be formed using any of the details described herein (including but not limited to the description of FIGS. 1A-1D, and FIGS. 2A-2B), and in any of the configurations described herein, among others.

While FIG. 5 is illustrated and described in terms of a method for addressing off-axis scrub through the determination of at least one anti-node, and forming notches at corresponding locations, it is understood that methods of providing wedge bonding tools (or associated wedge bonding systems) is not limited thereto. For example, notches may be formed in the wedge bonding tools for other purposes as described herein, such as: for improved directional delivery of ultrasonic scrub energy via axial balancing; an improved gain relationship between an ultrasonic transducer and the wedge bonding tool; amongst others.

In accordance with the invention, the notches may have dimensions desired in the specific application. For example, the dimensions of the notches (e.g., the depth, the width, the length, etc.) may provide changes to the wedge bonding tool characteristics such as a resonant frequency for off-axis parasitic modes. An exemplary range for the depth of the notches (e.g., the depth that the notches extend into the surface of the body portion) is between 5-30 mils, and an exemplary range for the width (e.g., the width of an elongated notch) of the notches is also between 5-30 mils.

The teachings of the present invention may be applied to existing wedge bonding tools and wedge bonding systems. Further, the teachings of the present invention may also be applied to the design of new wedge bonding tools and wedge bonding systems, which may be designed to have predetermined vibration characteristics, etc.

Although the invention is described primarily with respect to the inclusion and/or formation of notches in a surface of a wedge bonding tool to provide a desired result, it is not limited thereto. For example, rather than remove material to form a notch, material may be included (e.g., added or otherwise provided during formation of the wedge bonding tool) to affect the mode shapes of the wedge bonding tool. In one specific example, bumps (or other material deposits that may affect wedge bonding tool stiffness or mass in a desired direction) may be provided at the anti-nodes of the wedge bonding tool in the off-axis direction to affect the resonant frequency of such parasitic modes. FIG. 6 illustrates an example of such a wedge bonding tool.

Referring specifically to FIG. 6, a wedge bonding tool 600 is illustrated that is similar in many respects to wedge bonding tool 100 described in connection with FIGS. 1A-1D. FIG. 6 illustrates wedge bonding tool 600 including an elongate body portion extending between top end portion 600a and tip end portion 600b. Tip end portion 600b includes a working surface 600c configured to contact a wire material during formation of wire bonds between the wire material and respective bonding locations. The body portion of wedge bonding tool 600 includes front surface 600d, a back surface (not visible in FIG. 6, but similar to back surface 100e/200e of tools 100/200), side surface 600f, and side surface 600g.

In contrast to the notches 102 defined by side surfaces of wedge bonding tool 100 in FIGS. 1A-1D, FIG. 6 illustrates protrusions 602 provided along the side surfaces of wedge bonding tool 600 (where the side surfaces may be referred to as a first side, and a second side, or opposite sides, of wedge bonding tool 600). In the embodiment of the invention shown in FIG. 6, the plurality of protrusions 602 are provided as pairs of protrusions, provided opposite one another on opposite sides of wedge bonding tool 600. For example, tools according to the invention may include at least three pairs of protrusions, where each of the pairs of protrusions includes a protrusion opposite another protrusion on opposite sides of the body portion of the tool.

Such protrusions 602 may be integrated to the body portion (e.g., made from the same piece of material), or maybe added to the body portion. Although protrusions 602 are provided on each of the side surfaces of wedge bonding tool 600 (as opposed to on the front and/or back of the tool, where the tool maybe configured to scrub in a direction from front to back during wire bonding), it is understood that such protrusions may instead (or in addition to) be provided on the front and/or back surface of the body portion.

Although protrusions 602 are provided in pairs, opposite one another (e.g., there are 5 pairs shown in FIG. 6, on opposite sides of wedge bonding tool 600), it is understood that the invention is not limited thereto. Further still, the shape of the protrusions is exemplary in nature, and any protrusion shape extending beyond the relevant surface of the wedge bonding tool (e.g., a side surface, the front surface, the back surface, etc.) is contemplated.

In FIG. 6, protrusions 602 are provided to adjust an off-axis parasitic mode of wedge bonding tool 600 (e.g., an x-axis in a system where the desired scrub occurs along the y-axis, that is, the desired scrub occurs in a direction from the front of the tool to the back of the tool—which is in and out of the page in FIG. 6). Such an adjustment may be accomplished by changing the mass of wedge bonding tool 600 at the off-axis anti-nodes of the parasitic mode, thereby adjusting a resonant frequency of wedge bonding tool 600 in the off-axis direction to move that resonant frequency further from the operating frequency of wedge bonding tool 600.

Of course, protrusions may be provided on one or more surface of a wedge bonding tool to achieve a different result, such as, for example: improved directional delivery of ultrasonic scrub energy via axial balancing; an improved gain relationship between an ultrasonic transducer and the wedge bonding tool; amongst others.

Although the invention has been described primarily in terms of a desired scrubbing motion along the y-axis, and the undesired scrubbing along the x-axis, these directions are exemplary in nature, and non-limiting.

Although the invention has been described largely in terms of notches/protrusions provided in pairs on opposite sides of a body portion of a wedge bonding tool, it is not limited thereto. For example, the notches/protrusions may be provided in other configurations (e.g., not in pairs on opposite sides of the wedge bonding tool). Likewise, the invention is not limited to notches/protrusions being provided at each anti-node. For example, certain anti-nodes may be provided with notches/protrusions, and other anti-nodes without notches/protrusions. Further, notches/protrusions may be provided at locations that are not anti-nodes.

Although the invention has been described primarily in terms of wedge bonding tools, it is not limited thereto. The teachings of the invention have applicability in connection with a number of ultrasonic bonding applications such as ball bonding tools, flip chip bonding tools, thermocompression bonding tools, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:
1. A wedge bonding tool comprising:
a body portion including a tip portion, the tip portion including a working surface configured to contact a wire material during formation of a wedge bond,
wherein a plurality of notches are defined by one or more surfaces of the body portion, wherein each of the plurality of notches is provided coincident with an anti-node of the wedge bonding tool in an off-axis direction.

2. The wedge bonding tool of claim 1 wherein the plurality of notches are provided on each of a first side and a second side of the body portion.

3. The wedge bonding tool of claim 1 wherein the plurality of notches are provided on opposite sides of the body portion.

4. The wedge bonding tool of claim 1 wherein each of the plurality of notches are provided opposite another of the plurality of notches.

5. The wedge bonding tool of claim 1 wherein a depth of each of the plurality of notches is in a range between 5-30 mils.

6. The wedge bonding tool of claim 1 wherein a width of each of the plurality of notches is in a range between 5-30 mils.

7. The wedge bonding tool of claim 1 wherein each of the plurality of notches extends in a linear direction.

8. The wedge bonding tool of claim 1 wherein the tip portion of the wedge bonding tool is configured to scrub in a direction from a front of the wedge bonding tool to a back of the wedge bonding tool, and wherein the plurality of notches are provided along side surfaces between the front and the back of the wedge bonding tool.

9. The wedge bonding tool of claim 1 wherein the plurality of notches include at least three pairs of notches, each of the pairs of notches including a notch opposite another notch on opposite sides of the body portion.

10. A wedge bonding system comprising:
   an ultrasonic transducer;
   a wedge bonding tool carried by the ultrasonic transducer, the wedge bonding tool including a body portion having a tip portion, the tip portion including a working surface configured to contact a wire material during formation of a wedge bond, a plurality of notches being defined by one or more surfaces of the body portion; and
   a support structure configured to support a workpiece during formation of the wedge bond on the workpiece, wherein each of the plurality of notches is provided coincident with an anti-node of the wedge bonding tool in an off-axis direction.

11. The wedge bonding system of claim 10 wherein the plurality of notches are provided on each of a first side and a second side of the body portion.

12. The wedge bonding system of claim 10 wherein the plurality of notches are provided on opposite sides of the body portion.

13. The wedge bonding system of claim 10 wherein the tip portion of the wedge bonding tool is configured to scrub in a direction from a front of the wedge bonding tool to a back of the wedge bonding tool, and wherein the plurality of notches are provided are provided along side surfaces between the front and the back of the wedge bonding tool.

14. A method of providing a wedge bonding tool, the method comprising the steps of:
   (a) determine a location of at least one anti-node of a wedge bonding tool in an off-axis direction of the wedge bonding tool; and
   (b) forming a notch in a surface of the wedge bonding tool at the at least one anti-node.

15. The method of claim 14 wherein step (a) includes modeling the wedge bonding tool to determine the location of the at least one anti-node of the wedge bonding tool.

16. The method of claim 14 wherein step (a) includes taking vibration measurements to determine the location of the at least one anti-node of the wedge bonding tool.

17. The method of claim 14 wherein step (b) includes forming a plurality of notches in the surface of the wedge bonding tool, wherein a portion of the plurality of notches are provided on each of a first side and a second side of a body portion of the wedge bonding tool.

18. The method of claim 14 wherein step (b) includes forming a plurality of notches in the surface of the wedge bonding tool, wherein the plurality of notches includes a plurality of pairs of notches, wherein each of the pairs of notches being provided on opposite sides of a body portion of the wedge bonding tool.

* * * * *